United States Patent [19]

Yamauchi et al.

[11] Patent Number: 5,308,918
[45] Date of Patent: May 3, 1994

[54] SIGNAL DELAY CIRCUIT, FIR FILTER AND MUSICAL TONE SYNTHESIZER EMPLOYING THE SAME

[75] Inventors: Akira Yamauchi; Toshifumi Kunimoto; Chifumi Takeuchi; Iwao Higashi, all of Hamamatsu, Japan

[73] Assignee: Yamaha Corporation, Hamamatsu, Japan

[21] Appl. No.: 869,448

[22] Filed: Apr. 16, 1992

Related U.S. Application Data

[62] Division of Ser. No. 511,217, Apr. 19, 1990, abandoned.

[30] Foreign Application Priority Data

Apr. 21, 1989 [JP] Japan ................ 1-102376
May 18, 1989 [JP] Japan ................ 1-125326

[51] Int. Cl.$^5$ ............................ G10H 5/02
[52] U.S. Cl. ............................ 84/622; 84/624;
84/659; 84/661; 84/DIG. 9; 84/DIG. 10; 84/DIG. 26
[58] Field of Search ............ 84/622, 624, 604, 605, 84/658, 661, DIG. 26, DIG. 10, 630, 692, 699, 700, DIG. 9

[56] References Cited

U.S. PATENT DOCUMENTS

| | | | |
|---|---|---|---|
| 4,785,706 | 11/1988 | Toshifumi | 84/DIG. 10 |
| 4,984,276 | 1/1991 | Smith | 381/63 |
| 5,212,334 | 5/1993 | Smith, III | 84/622 |
| 5,245,127 | 9/1993 | Yamauchi | 84/624 |

Primary Examiner—William M. Shoop, Jr.
Assistant Examiner—Brian Sircus
Attorney, Agent, or Firm—Graham & James

[57] ABSTRACT

The present invention provides a signal delay circuit for substantially steplessly changing a delay interval. The signal delay circuit is composed essentially of a delay controller, a first delay circuit, and a second delay circuit. The delay controller generates and outputs control data consisting of a real number bearing control information for controlling the delay interval, the real number consists of an integral portion and a fractional portion. The first delay circuit receives an incidental signal, delays the incidental signal for creating a first intermediate signal, and outputs the first intermediate signal, the first intermediate signal being delayed with respect to the incidental signal by an interval which is a product of a predetermined cardinal interval and the integral portion of the real number. The second delay circuit receives the first intermediate signal, produces at least one second intermediate signal by delaying the first intermediate signal by at least one interval which is an integral multiple of the predetermined cardinal interval, interpolates the first intermediate signal and said at least one second intermediate signal for producing a delayed signal, and outputs the delayed signal, the delayed signal being delayed with respect to the first intermediate signal by an interval which is a product of the predetermined cardinal interval and the fractional portion of the real number. As a result, the delayed signal is delayed with respect to the incidental signal by a delay interval which is a product of the predetermined cardinal interval and the real number output by the delay control means.

4 Claims, 6 Drawing Sheets

SIGNAL DELAY CIRCUIT, FIR FILTER AND MUSICAL TONE SYNTHESIZER EMPLOYING THE SAME

This is a division of application Ser. No. 07/511,217, filed on Apr. 19, 1990, now abandoned.

BACKGROUND OF THE INVENTION

1. Field of the Invention

The present invention relates to signal delay circuits, FIR (finite impulse response) filters, and musical tone synthesizing devices which employ signal delay circuits and/or FIR filters.

2. Prior Art

Methods of synthesizing the musical sounds of conventional musical instruments (non-electronic) are known in which the mechanism of sound generation in the musical instrument is simulated to obtain a tone generation model which is then applied to the synthesis of the sounds of the target musical instrument. In Japan, such methods have been disclosed in, for example, Japanese Patent Application Laid-Open, No. 63-40199, and U.S. Pat. No. 4,130,043. Below, a conventional musical tone synthesizing device based on this technology will be described.

In FIG. 1, the layout of a musical tone synthesizer is schematically shown in which the musical tone generation of a woodwind instrument is simulated. In the drawing, ROM (read only memory) 11 is shown in which a data table for a non-linear function expressing the response characteristics of the reed of a woodwind instrument are recorded.

Loop circuit 12 simulates the tubular portions of the woodwind instrument, that is, loop circuit 12 simulates the resonator tube transmission characteristics of the instrument. In loop circuit 12, multiple delay circuits having a fixed delay are arranged in series. Additionally, connected into the loop circuit 12 at their respective corresponding locations are various elements including junction units (impedance coupling circuits) for simulating the dispersion of generated air pressure waves created at locations in the tubular portions where the diameter varies and at tone holes. Additionally, filters, etc. are provided at corresponding locations which simulate acoustic losses occurring within each part of the resonator tube. In general, to the extent that the frequency of the generated sound is high, acoustic losses are great. For this reason, low pass filters are used for the above mentioned filters included in the loop circuit 12.

Pressure data PD corresponding to the air pressure applied at the reed by a performer playing an actual woodwind instrument is supplied to subtracter circuit 13, and from this supplied data value, the feedback signal (this value corresponds to the pressure of the reflected pressure wave from the resonator tube) from loop circuit 12 is subtracted, the result of the subtraction operation then supplied to ROM 11.

With a circuit so constructed, pressure data PD corresponding to the air pressure applied to a reed is supplied as address data to ROM 11 via subtracter circuit 13. After the address data is supplied to ROM 11 from subtracter circuit 13, data corresponding to the address data is output from ROM 11 which then travels through loop circuit 12, then returning to subtracter circuit 13. The returned value is then subtracted from the pressure data PD which is currently being supplied to subtracter circuit 13, the result of the subtraction again supplied to ROM 11, and the cycle is then repeated. Thus, it can be seen from this discussion and from FIG. 1 that a closed loop is established by this construction. Accordingly, data is caused to propagate within a closed loop in which a resonance function is established, whereby a musical signal is output.

With this kind of musical tone synthesizer, to the extent that the supplied pressure data PD corresponds to a high air pressure, the fidelity improves for the generated frequency spectrum of the simulated reed vibration, as well as for the musical effect of simulated transmission characteristics of air pressure waves from tubular portions of the instrument. Thus, to the extent that the supplied pressure data PD corresponds to a high value, a more natural sound is synthesized, that is, a sound that more closely corresponds to the sound of the actual musical instrument being simulated.

Simulation of the musical sound of string instruments can be achieved using a circuit similar that shown in FIG. 1. In such a case, ROM 11 holds a data table for a non-linear function expressing the elastic characteristics of the strings of the string instrument. When simulating a string instrument, loop circuit 12 simulates the propagation characteristics of vibrations in the strings of the string instrument. Just as with simulation of a woodwind instrument, loop circuit 12 includes multiple delay circuits having a fixed delay which are arranged in series. Similar to the simulation of a woodwind instrument, loop circuit 12 includes filters, junction units, etc. at their corresponding locations for simulating the resonator box, acoustic losses and other characteristics of the string instrument.

For simulation of the sound of either a woodwind instrument or a string instrument, by adjusting the delay interval of the signal propagated in the loop circuit 12, the resonant frequency can be adjusted, that is, the pitch of the generated sound can be adjusted. Basically, in this type of circuit, the delay interval of the signal propagated in the loop circuit 12 is adjusted by a switch means whereby the number of individual delay circuits in series with the loop can be selected.

However, with the pitch control as described in the preceding paragraph, the loop circuit 12 delay interval must necessarily be an integral multiple of the delay interval of one individual delay circuit. Accordingly, only pitches of which the fundamental frequency is given by:

$$f = 1/n\tau \text{ where } n = 1, 2, 3, \ldots.$$

can be generated. Thus, considerable limitations exist in regard to the pitches that can be generated with this kind of circuit. In addition to not being able to freely select a pitch to be generated, because the range of pitches that can be generated is noncontinuous, it is not possible to incorporate "pitch benders", vibrato functions, and other control means that rely on variation of pitch over a continuous range.

In FIG. 2, a circuit diagram for a musical tone synthesizer is shown suitable for generation of musical tones in which the envelope of a piano or similar instrument is simulated, wherein the maximum sound intensity occurs immediately after the tone is initiated, followed by a gradual decrease in intensity. Compared with a percussion instrument such as a drum the envelope of which also demonstrates maximum sound intensity immediately following the onset of the sound, the decline in sound intensity is relatively prolonged with a piano. In the case of a horn or woodwind instrument, both the timing of maximum intensity and the decline in intensity are delayed compared with a piano or drum.

As shown in the diagram, an adder circuit 1, delay circuit 2, FIR (finite impulse response) filter 3, and multiplier circuit 4 are sequentially provided, thereby forming a closed loop. In the illustrated circuit, the delay circuit 2 consists of a plurality of delay elements serially provided, whereby the input signal is delayed by a sampling time $\tau_s$, and then output to FIR filter 3. Based on pitch data supplied to the delay circuit 2 from a pitch control circuit (not shown in the drawing), the number of delay stages n and hence the sampling time $\tau_s$ can be selected. The multiplier coefficient g for multiplier circuit 4 is selected so that the value for the closed loop gain from adder circuit 1 to delay circuit 2 to FIR filter 3 to multiplier circuit 4 back to adder circuit 1 again is slightly smaller than 1.

As shown in FIG. 2, FIR filter 3 is made up of delay circuit 5 wherein the input signal to FIR filter 3 is delayed by a sampling time $\tau_s$ and then output, multiplier circuit 6 wherein the FIR filter 3 input signal is multiplied by $1-\alpha$ and then output, multiplier circuit 7 to which the output of delay circuit 5 is supplied where it is multiplied by $\alpha$ and then output, and adder circuit 8 wherein the output of multiplier circuit 6 and multiplier circuit 7 are added and then output. This FIR filter 3 functions as a timbre control low pass filter, wherein the coefficient $\alpha$ is chosen so as be between 0 and 0.5.

Below, the characteristics of FIR filter 3 will be described. For an FIR filter circuit having the layout shown in FIG. 2, the impulse response function $H_1(z)$ is expressed by Equ. 1 shown below.

$$H_1(z) = 1 - \alpha + \alpha z^{-1} \qquad \text{Equ. 1}$$

The frequency characteristics $f_1(\omega)$ of the FIR filter circuit, where $\omega$ indicates the angular frequency of the input signal, are given by substituting $\exp(-j\omega\tau_s)$ for $z^{-1}$ in Equ. 1 resulting in Equ. 2 shown below.

$$\begin{aligned}F_1(\omega) &= 1 - \alpha + \alpha\exp(-j\omega\tau_s) \\ &= 1 - \alpha + \alpha\cos\omega\tau_s - j\alpha\sin\omega\tau_s\end{aligned} \qquad \text{Equ. 2}$$

The amplitude $A_1(\omega)$ is then given by Equ. 3 below.

$$\begin{aligned}A_1(\omega) &= |F_1(\omega)| \\ &= ((1 - \alpha + \alpha\cos\omega\tau_s)^2 + \alpha^2\sin^2\omega\tau_s)^{0.5} \\ &= (1 - 2\alpha(1-\alpha)\sin^2\omega\tau_s)^{0.5}\end{aligned} \qquad \text{Equ. 3}$$

According to Equ. 3, to the extent that angular frequency $\omega$ is large, $A_1(\omega)$ becomes small. Here $\omega$ is defined so as to satisfy the relation $\omega\tau_s \leq \pi/2$. Thus, it can be seen that the FIR filter 3 functions as a low pass filter.

The phase characteristics $P_1(\omega)$ are given by Equ. 4 below.

$$P_1(\omega) = \arctan(F_1(\omega))$$
$$= \tan^{-1}\frac{-\alpha\sin\omega\tau_s}{1 - \alpha + \alpha\cos\omega\tau_s} \qquad \text{Equ. 4}$$

In Equ. 4, $\arctan(F_1(\omega))$ expresses the phase angle of $F_1(\omega)$. In the musical tone synthesizer circuit under discussion, the angular frequency $\omega$ of the input signal is significantly small compared with sampling frequency $f_s$ which equals $1/\tau_s$. Accordingly, assuming the approximation $\tan^{-1}x \approx x$ which is true for sufficiently small values of x, and further assuming that $\cos\omega\tau_s \approx 1$ and that $\sin\omega\tau_s \approx \omega\tau_s$ which are true given that $\omega$ is sufficiently small, the approximate equivalence shown in Equ. 5 below can be derived from Equ. 4.

$$P_1(\omega) \approx -\alpha\omega\tau_s \qquad \text{Equ. 5}$$

Accordingly, the effective delay interval $\tau_a$ of the FIR filter 3 is given by Equ. 6 below.

$$\begin{aligned}\tau_a &= -dP_1(\omega)/d\omega \\ &\approx \alpha\tau_s\end{aligned} \qquad \text{Equ. 6}$$

With the musical tone synthesizer circuit under discussion, under ordinary circumstances, a signal having a great number of frequency components, for example an impulse signal, is supplied to adder circuit 1. From adder circuit 1, the signal is successively supplied to delay circuit 2, FIR filter 3, multiplier circuit 4, and then back again to adder circuit 1 to repeat the cycle, traveling over the closed loop thus formed.

For a delay circuit 2 delay interval of $n\tau_s$ and a delay interval of $\tau_a$ for the FIR filter 3 as a whole, the required time $\tau$ for a signal to traverse one complete lap of the musical tone synthesizer circuit shown in FIG. 2 is given by Equ. 7 below.

$$\tau = n\tau_s + \tau_a \qquad \text{Equ. 7}$$

In this case, the closed loop gain frequency characteristics of the circuit are such that, the frequency spectrum for the generated signal exhibits maximum values at integral multiples of the fundamental frequency $f_1$ which equals $1/\tau$. Accordingly, among the frequency components of an input impulse signal, only those frequencies equal to the above mentioned fundamental frequency $f_1$ and harmonics which are integral multiples thereof continue to circulate around the closed loop circuit, other frequency components being effectively suppressed. For the frequency components that continue to circulate around the closed loop circuit, each component is governed according to the amplitude characteristics given by Equ. 3 above. In this way, the wave form of the signal the propagates over the closed loop circuit, that is the timbre of the musical signal, is regulated. Due to the fact, as stated above, that the multiplier coefficient g for multiplier circuit 4 is selected so that the value for the closed loop gain is slightly smaller than 1, the amplitude of the circulating signal gradually diminishes. In the closed loop circuit under discussion, the output of adder circuit 1 is used as the musical output signal.

With the above described FIR filter 3, as can be understood from Equ. 6 above, when coefficient $\alpha$ is varied, the delay interval $\tau_a$ in turn varies. Thus, with this kind of conventional musical tone synthesizer circuit employing an FIR filter for timbre control as part of a closed loop circuit, when an attempt is made to adjust the timbre by varying multiplier coefficient $\alpha$, and hence $1-\alpha$, because the delay interval for the closed loop circuit as a whole varies, the pitch of the generated tone ends up varying as well which is undesirable.

SUMMARY OF THE INVENTION

In consideration of the above, it is an object of the present invention to provide a signal delay circuit for which the signal delay interval can be arbitrarily chosen at any desired value, and for which the signal delay interval can be continuously varied. A second object of the present invention is to provide a musical tone synthesizer for which, by using a signal delay circuit for which the signal delay interval can be arbitrarily chosen at any desired value, and for which the signal delay interval can be continuously varied, a musical tone of any desired pitch can be generated, and furthermore, for which the pitch of the generated musical tone can be continuously varied.

Moreover, as a third object of the present invention, an FIR filter is provided for which even when variable parameters employed in the filter circuitry are varied, the total delay time does not vary. A fourth object of the present invention is to provide a musical tone synthesizer for which, by using an FIR filter for the timbre control filter of which the total delay time does not vary, it is possible to generate a musical tone for which the pitch of the generated tone does not vary even when the timbre of the generated tone is varied by variation of filter parameters.

In consideration of the first object of the present invention, a signal delay circuit is provided having a delay control means by which signal delay information is generated which expresses operating parameters corresponding to a signal propagation delay interval. The above mentioned signal delay information is a real number which when expressed as a decimal number, has an integral portion which lies to the left of the decimal point and is given by N, and has a fractional portion which lies to the right of the decimal point and is given by a. Additionally, this signal delay circuit has a first delay means, whereby the input signal is delayed by a fixed delay interval multiplied by N and then output, where N is the integral portion of the above mentioned signal delay information. Further, this signal delay circuit has a second delay means, having a delay unit comprised of one or more delay elements, each constituting a single node and having a fixed delay interval, wherein the delayed output of each node is multiplied by a coefficient determined based on the fractional portion of the above mentioned signal delay information given by a, the result of each such multiplication operation being summed, the result of which is output.

In consideration of the second object of the present invention, a musical tone synthesizer is provided having an exciting means wherein an excitement signal is generated and output based on both an input signal and a returned signal, and also having a signal delay circuit which is consistent with the signal delay circuit of the first object of the present invention wherein the above mentioned excitement signal is delayed by a fixed interval and then returned to the above mentioned exciting means. With this musical tone synthesizer, by causing the above mentioned exciting means and signal delay circuit to be in a resonant state, a musical signal can be generated corresponding to a desired pitch.

Further, in consideration of the third object of the present invention, an FIR filter is provided in which:

(a) given a fixed time interval $\tau_s$, for an input signal, $2N+1$ output signals $D_k$ are output, the respective delay interval $\tau_k$ for each output signal $D_k$ given by $$\tau_k = (N+k)\tau_s$$

where N is the above described integral portion of the above mentioned signal delay information, and k represents the $2N+1$ integral values ranging from $-N$ to N inclusive;

(b) for each of the above mentioned $2N+1$ output signals $D_k$, each is multiplied by a corresponding coefficient $f_k$ and the result of all of the above mentioned multiplication operations are summed together and the resulting sum output as filter output; and (c) the above mentioned coefficients $f_k$ are such that $2N+1$ values exist, each corresponding to a respective one of the $2N+1$ output signals $D_k$, and are defined such that for any coefficient $f_k$, $f_k = f_{-k}$.

In consideration of the fourth object of the present invention, a musical tone synthesizer is provided having an exciting means wherein an excitement signal is generated and output based on both an input signal and a returned signal, and also having a signal delay circuit wherein the above mentioned excitement signal is delayed by a fixed interval and then returned to the above mentioned exciting means, whereby the above mentioned exciting means and signal delay circuit together with an FIR filter circuit consistent with that of the above described third object of the present invention provided as a timbre control filter are combined to form a closed loop.

DETAILED DESCRIPTION OF THE PREFERRED EMBODIMENTS

First Preferred Embodiment

In the following sections the preferred embodiments of the present invention will be described in detail with reference to the diagrams. First of all, a first preferred embodiment will be described with reference to FIGS. 3 and 4.

Figure 1:
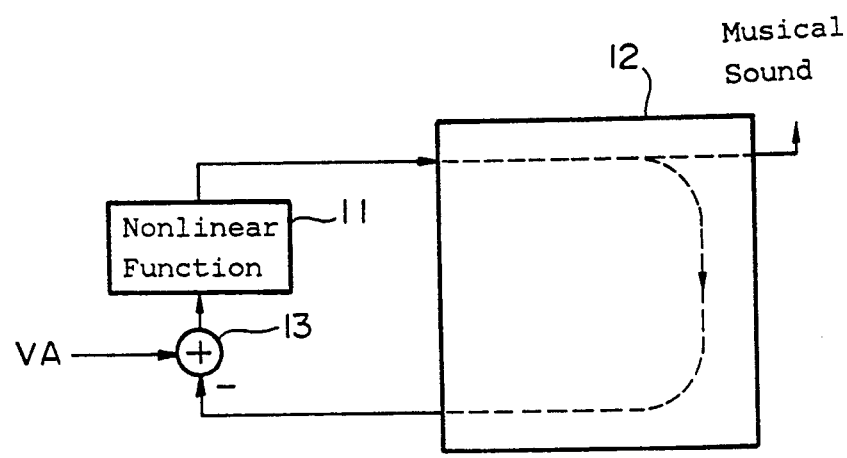
FIGS. 1 and 2 are schematic circuit drawings showing conventional musical tone synthesizer circuits.
Figure 2:
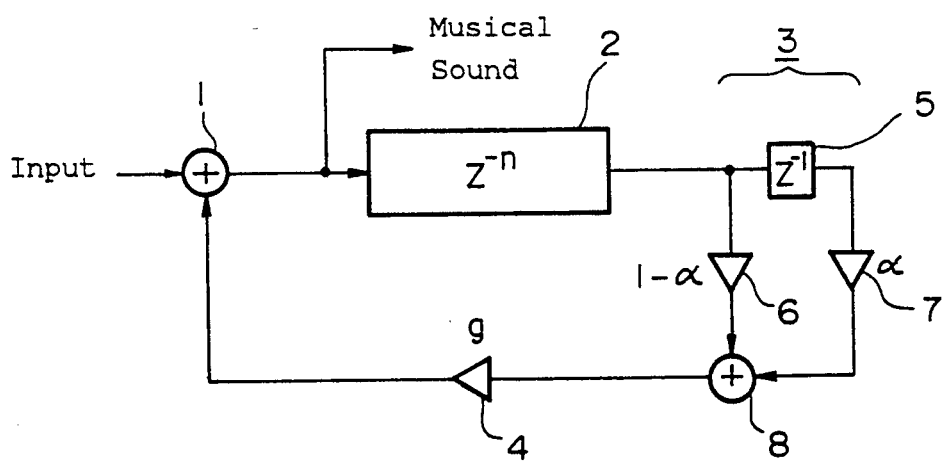
Figure 3:
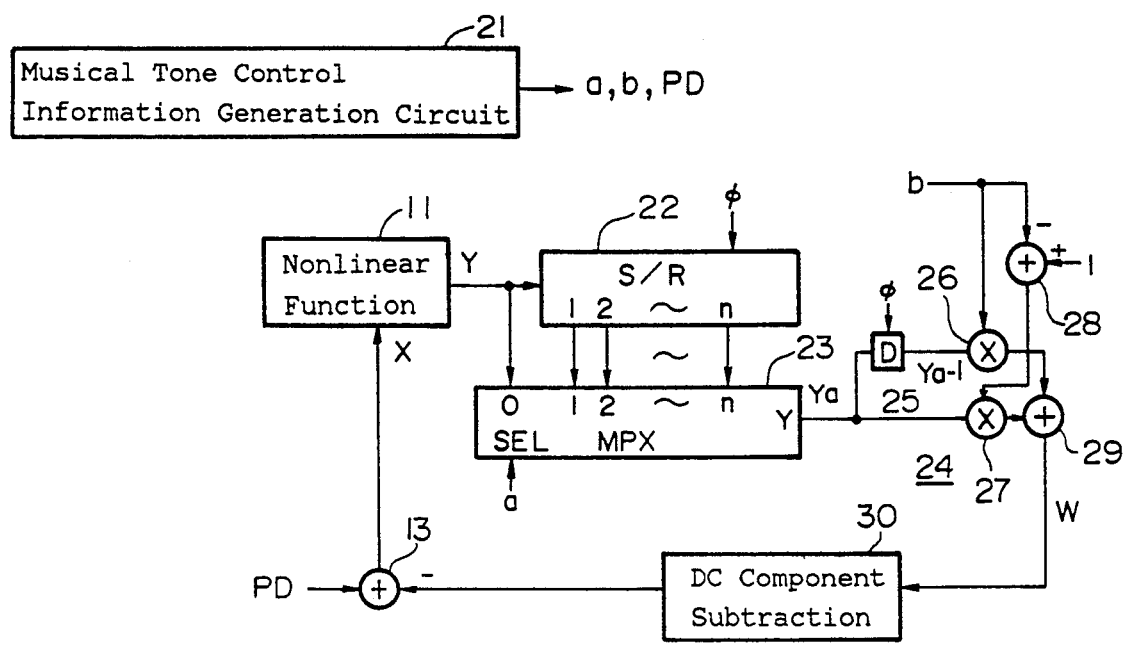
FIG. 3 is a block diagram showing the layout of a musical tone synthesizer of a first preferred embodiment of the present invention.

In FIG. 3, a block diagram illustrating the layout of the musical tone synthesizer of the present embodiment is shown. In this diagram, those components which are identical to elements shown in FIGS. 1 and 2 illustrating conventional devices will retain the original identifying numerals. Within musical tone control information generation circuit 21, control parameters a, b, PD, etc. are generated based on input signals supplied to thereto by various operators (not shown), for example a keyboard. For the above mentioned musical tone control information, included are step number data having integral and fractional portions, a and b respectively, this step number data being used for determining the generated pitch. Additionally, pressure data PD corresponding to air pressure applied to the reed of woodwind instrument, and other types of data may be included.

Figure 4:
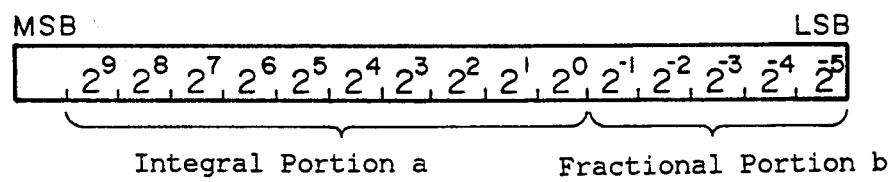
FIG. 4 is diagram showing a data structure employed in musical tone synthesizer shown in FIG. 3.

In FIG. 4, an example of a data structure for the above mentioned step number data is shown. As shown in FIG. 4, the data structure consists of a sixteen bits. The five lowest order bits from the least significant bits (LSB), bits zero to four are dedicated to represent the fractional portion b of the step number data. Bits five to fourteen, are dedicated to represent the integral portion a of the step number data. The most significant bit (MSB) of the most significant byte, bit fifteen, may be used to register additional data, for example as a parity bit.

Just as in the case with the conventional circuit shown in FIG. 1, a data table is recorded in ROM 11 representing a nonlinear function expressing the elastic characteristics of the reed of a woodwind instrument. Direct current pressure data (bias data) PD corresponding to the air pressure applied to the reed of a woodwind instrument is supplied to subtracter circuit 13 from musical tone control information generation circuit 21. From subtracter circuit 13, the signal is supplied to ROM 11 as address data. Data Y corresponding to the address data supplied to ROM 11 is then supplied to shift register 22 as well as to multiplexer 23 from ROM 11. Within shift register 22, the data Y supplied from ROM 11 is sequentially shifted bit-wise in synchrony with a sampling clock $\phi$, until all of data Y has been shifted into multiplexer 23. The above mentioned step number data is also supplied to multiplexer 23 wherein the integral portion a of the step number data is selected by multiplexer 23. When the clock rate of sampling clock $\phi$ is given by $\tau$, after a delay interval given by $a\tau$, data Y is output from multiplexer 23 as delayed data $Y_a$ to interpolation circuit 24.

The above mentioned interpolation circuit 24, wherein a delay corresponding to the above mentioned fractional portion b of the step number data is effected, is made up of a unit sampling time delay circuit 25, multiplier circuit 26, multiplier circuit 27, subtracter circuit 28, and adder circuit 29. Delayed data $Y_a$ from multiplexer 23 is supplied directly to both unit sampling time delay circuit 25 and multiplier circuit 27.

In the unit sampling time delay circuit 25, the supplied signal is delayed a unit sampling period $\tau$, and then output to multiplier circuit 26 as delayed data $Y_{a-1}$. Thus, at any given instant, the delayed data $Y_{a-1}$ supplied to multiplier circuit 26 corresponds to data obtained from multiplexer 23 one unit sampling period $\tau$ prior to the delayed data $Y_a$ supplied to multiplier circuit 27. Then, delayed data $Y_{a-1}$ is multiplied by data b in multiplier circuit 26, and in multiplier circuit 27, the delayed data $Y_a$ is multiplied by $1-b$, which was calculated in subtracter circuit 28.

The results of the multiplication operations carried out in multiplier circuit 26 and multiplier circuit 27 are then summed in adder circuit 29 to obtain data W, as is shown in Equ. 8 below.

$$W = bY_{a-1} + (1-b)Y_a \qquad \text{Equ. 8}$$

Thus, by the above described signal processing within interpolation circuit 24, linear interpolation is carried out on delayed data $Y_a$ and delayed data $Y_{a-1}$ which corresponds to data one clock tick $\tau$ earlier than delayed data $Y_a$, whereby data W is obtained which is equivalent to delayed data $Y_a$ further delayed by a delay interval given by $b\tau$.

The above data W is supplied to direct current component removal filter 30 wherein direct current components are filtered from the supplied signal, after which the thus filtered signal is returned to subtracter circuit 13. The above mentioned direct current component removal filter 30 may be constructed, for example, from a circuit which accumulates supplied data and derives a time averaged value, combined with a subtracter circuit which subtracts the above described time averaged value from the input signal.

As is clear from FIG. 3 and the above discussion, the input signal PD travels from subtracter circuit 13 to ROM 11 to shift register 22 to multiplexer 23 to interpolation circuit 24 to direct current component removal filter 30 and then back subtracter circuit 13 to repeat the loop, thus constituting a closed loop circuit in which data circulates whereby resonance is generated. In this way, a resonating signal is generated which propagates over the closed loop and is supplied therefrom as a musical tone signal. Although not shown in FIG. 3, the output signal can be derived from any point in the closed loop, as dictated by design requirements. For the musical tone synthesizer circuit thus described, for input parameters from musical tone control information generation circuit 21 given by a and b as defined above, the characteristics of the control effected is given by Equ. 9 below.

$$f = 1/(a+b)\tau \qquad \text{Equ. 9}$$

Second Preferred Embodiment

In the following section, a second preferred embodiment will be described with reference to FIGS. 5 and 6.

Figure 5:
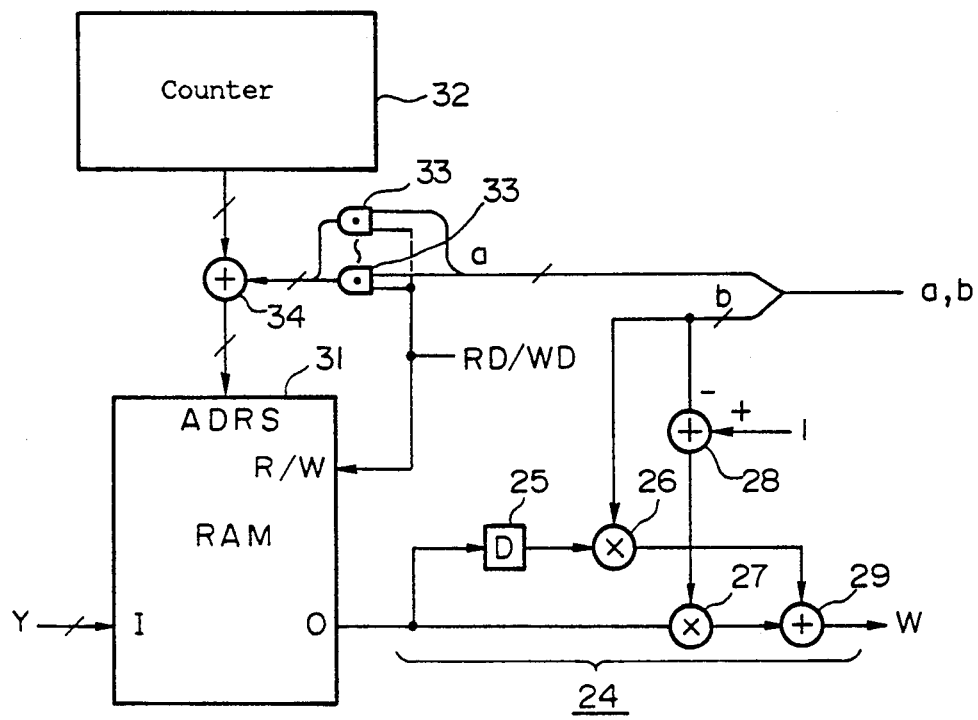
FIG. 5 is a block diagram showing the layout of a delay circuit of a second preferred embodiment of the present invention for use in a musical tone synthesizer.

In FIG. 5, a block diagram illustrating the layout of the delay circuit of the present embodiment is shown. The structure of the delay circuit of the present embodiment is distinct from and replaces the delay circuit employed in the musical tone synthesizer of the first preferred embodiment in which a shift register 22 and multiplexer 23 were used. In the following discussion, those components which are identical to elements shown in FIG. 3 will retain the original identifying numerals.

In FIG. 5, RAM (random access memory) 31 is shown in which the output data Y of ROM 11 is temporarily stored. Counter 32 is used as a read-write address counter for RAM 31. In the present preferred embodiment, count data for counter 32 is ten bits wide and counts in descending order. Counter 32 thus counts from 1023 to 0 ($2^{10}$ values). Based on a read-write selector signal RD/WD, RAM 31 switches between read mode and write mode. When RD/WD equals 0, RAM 31 is in write mode. Conversely, RD/WD equals 1, RAM 31 is in read mode.

Two AND gates 33 are provided. To one input terminal of each of the AND gates 33, the previously described integral portion a of the step number data is supplied, while to the other input terminal of each of the AND gates 33, the above mentioned read-write selector signal RD/WD is supplied. Adder circuit 34 adds the output of counter 32 and the combined outputs of AND gates 33 to generate address data which is then supplied to RAM 31. The output data of RAM 31 is supplied to an interpolation circuit 24 which is identical to that employed in the first preferred embodiment as shown in FIG. 3. In interpolation circuit 24, the output data of RAM 31 undergoes the previously described interpolation signal processing, after which the output signal W is supplied to a direct current component removal filter 30 just as in the case of the first preferred embodiment. In the present preferred embodiment, the output data Y of ROM 11 is stored in RAM 31 at address locations 0 to 1023.

Figure 6:
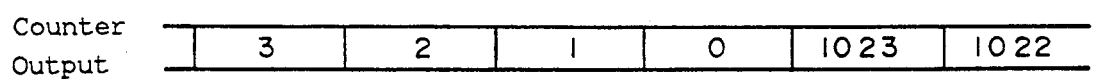
FIG. 6 is a time chart showing the operation of the delay circuit of the second preferred embodiment of the present invention.
Figure 6:
Figure 6:
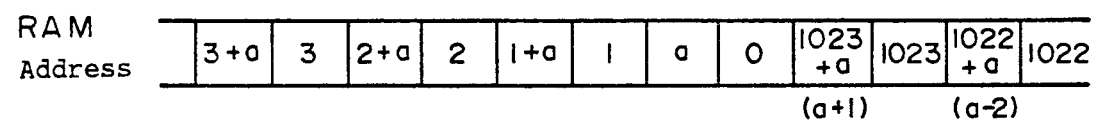

FIG. 6 is a time chart showing the operation of the delay circuit shown in FIG. 5. As can be seen in this drawing, read-write selector signal RD/WD switches back and forth between read and write mode in synchrony with the descending count of counter 32. Over one count cycle (the period over which the output of counter 32 remains at one clock value), for the first half of the cycle, the read-write selector signal RD/WD equals one (read mode), and for the second half of the cycle, the read-write selector signal RD/WD equals zero (write mode). When the read-write selector signal RD/WD equals zero, that is, when RAM 31 is in write mode, the output terminal of each AND gate 33 is forced to the zero state. When the read-write selector signal RD/WD equals one, that is, when RAM 31 is in read mode, integral portion a of the step number data is able to pass through both of the AND gates 33 and is thus supplied from their connected output terminals to adder circuit 34. Thus, when the read-write selector signal RD/WD equals one, integral portion a of the step number data is added to the current count value from counter 32 in adder circuit 34, the result of the addition then supplied to RAM 31 as address data.

Accordingly, as can be seen in FIG. 6, the data address during each read operation is equal to the current value of the integral portion a of the step number data added to the address of the following write operation. Thus, when the cycle length for one count cycle of counter 32 and one read-write cycle is given by τ, at any given moment, the data output from RAM 31 corresponds to the data Y written to RAM 31 at a point in time aτ earlier. In this way, a delay interval of aτ is imparted to the data Y.

As shown in FIG. 6, when counter 32 reaches zero, the following count is 1023 from which the downward count continues. Thus, after counter 32 passes zero, the read address continue as 1023+a, 1022+a, 1021+a, ... It can seen, therefore, that it is possible for the result of the addition operation in adder circuit 34 to exceed the maximum address value of RAM 31. However, because adder circuit 34 supplies only the ten lowest order bits of the calculated address to RAM 31, supplied address values remain in the range of 1023 to 0. Thus, for the case when the address values calculated in adder circuit 34 equal 1023+a, 1022+a, 1021+a, ..., the corresponding address values supplied to RAM 31 are a−1, a−2, a−3, ....

Application Example for a Keyboard Device

In the following section, application of the musical tone synthesizer of either the first or the second preferred embodiment of the present invention to a keyboard type input device will be described with reference to FIGS. 7 and 8.

Figure 7:
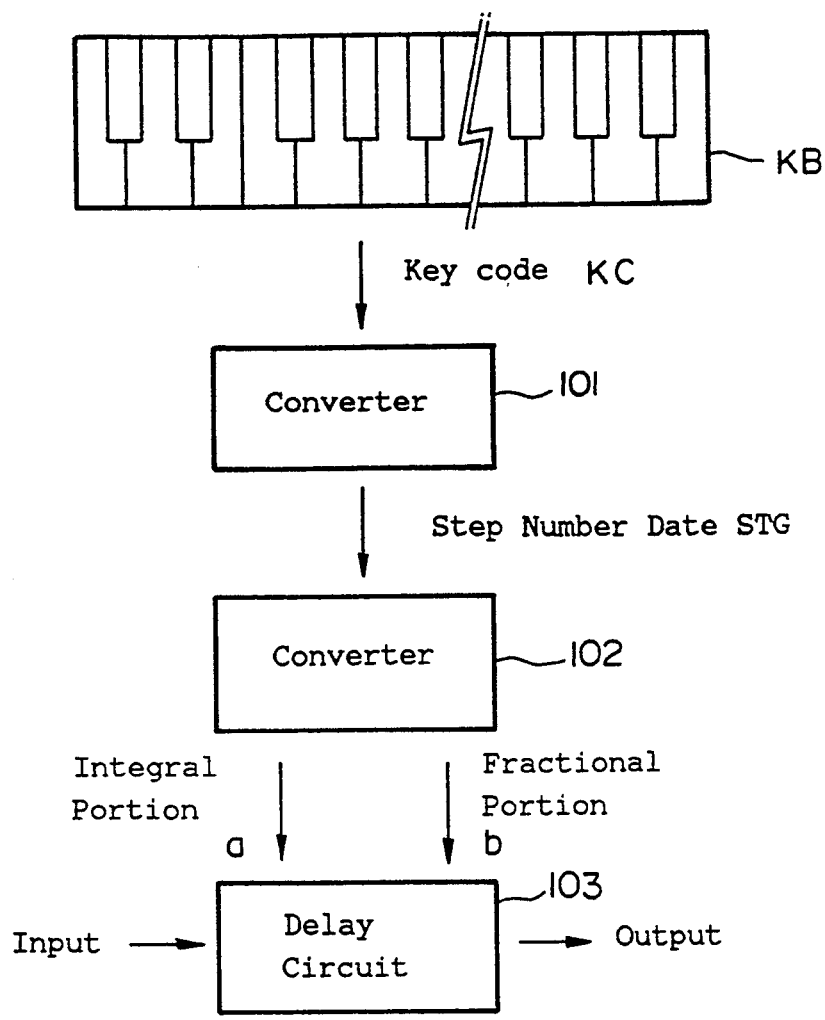
FIGS. 7 and 8 are block diagrams illustrating an applied example of the invention of the present invention in the form of a keyboard instrument.

As shown in FIG. 7, the output of keyboard unit KB which is in the form of key codes KC is supplied to converter 101, where it is converted to step number data STG. The above mentioned conversion to step number data STG is effected through Equ. 10 which is shown below.

$$STG = (50000/440) \times 2(45 - KC)/12 \qquad \text{Equ. 10}$$

The significance of each constant in Equ. 10 will be explained here. First of all, 50000 represents the sampling frequency $f_s$ of the musical tone synthesizer employed in the present example, given by $f_s = 1/\tau = 50$ kHz. The value 45 represents the key codes KC for a standard pitch A3, and 440 represents the frequency in hertz (Hz) of the standard pitch A3.

Shown in FIG. 7, converter 102 converts the step number data STG from converter 101 into the data format as shown in FIG. 4 and explained above. Delay circuit 103 can be constructed from a shift register 22, multiplexer 23, and an interpolation circuit 24 as with the delay circuit shown in FIG. 3, or it can be in the form of the delay circuit shown in FIG. 5.

For step number data of which the integral portion a is ten bits wide, when the delay circuit shown in FIG. 3 is used, the total number of delay stages that can be provided by shift register 22, multiplexer 23 and interpolation circuit 24 is 1024. For a musical tone synthesizer of which the sampling frequency $f_s$ is 50 kHz, using all 1024 delay stages, the lowest frequency that can be generated is 48.8 Hz. Because the fractional portion b of the step number data is five bits wide, fine control corresponding to a delay interval of 0.03125 ($2^{-5}$) delay steps is obtainable in interpolation circuit 24. Accordingly, at standard pitch A3, a maximum pitch resolution of on the order of 1/200 of a half note step (on the order of 1/200 of the difference between A and A#) can be achieved.

Figure 8:
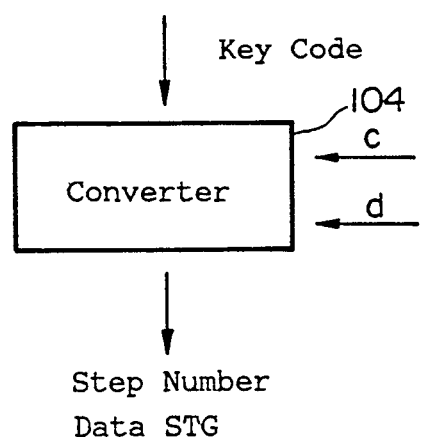

When it is desirable to employ a "pitch bender" or a vibrato function, rather than the converter 101 shown in FIG. 7, the converter 104 shown in FIG. 8 is used. In this case, conversion to step number data STG is effected through Equ. 11 which is shown below.

$$STG = (50000/440) \times 2(45 - KC + c + d)/12 \qquad \text{Equ. 11}$$

In the above Equ. 11 and in FIG. 8, c represents pitch bender data and d represents a vibrato data which are supplied to converter 104 from the musical tone control information generation circuit 21 shown in FIG. 3. In the case of a pitch bender, a fixed gradual shift in the generated pitch is created beginning immediately after the onset of tone generation, triggered by the key-on signal from the keyboard unit KB. The shifted tone remains in effect until the key-off signal from the keyboard unit KB is detected. Thus, in this way, a pitch that varies with time, commencing with the key-on signal can be generated based on the pitch bender data c supplied to converter 104. In the case of vibrato, vibrato data d is read from a periodic function table recorded in the musical tone control information generation circuit 21 and supplied to converter 104. Based on the supplied vibrato data d, the generated tone is caused to vary cyclically with respect to time.

Example of Tone Synthesizer Using Nonlinear Interpolation

In the following section, a variation of the musical tone synthesizer of the first preferred embodiment as shown in FIG. 3 will be described with reference to FIG. 9. For the apparatus under discussion, a non-linear interpolation method is used.

For the musical tone synthesizer shown in FIG. 3, if the output of multiplexer 23 is supplied to a conventional FIR (finite impulse response) filter, wherein FIR filter interpolation (or Lagrange interpolation) is carried out, it is possible to further improve the accuracy of the delay interval achieved corresponding to the fractional portion b of the step number data. Such a circuit is shown in FIG. 9. In this case, it is acceptable to either use a previously prepared data table for the multiplication coefficients used in the FIR filter, or to calculate the coefficients using the Lagrange transformation as will be described below.

Figure 9:
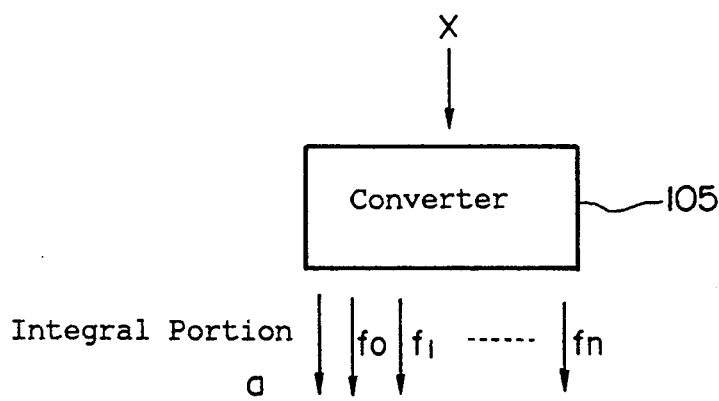
FIG. 9 is a schematic diagram illustrating the structure of a circuit for improving the accuracy of the delay interval employed in the first preferred embodiment of the present invention.
Figure 9:
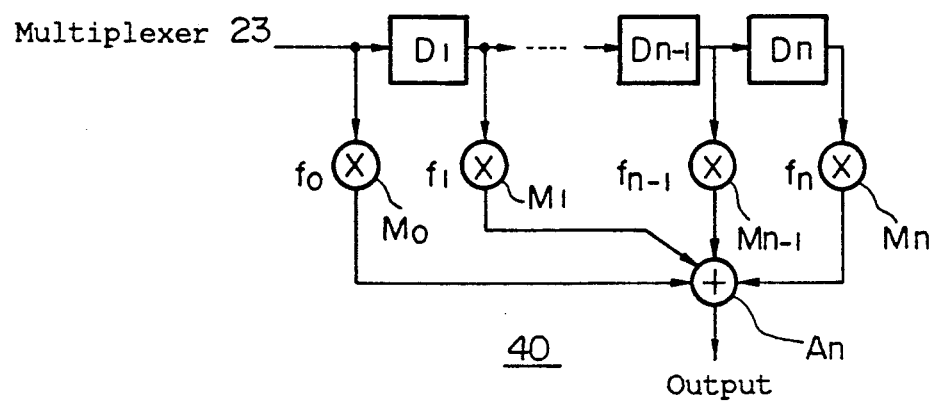

As shown in FIG. 9, FIR filter 40 is comprised of a shift register made up of a plurality of delay elements $D_0, D_1, \ldots, D_n$, a plurality of multiplier circuits $M_0, M_1, \ldots, M_n$ wherein the output of each delay element $D_0, D_1, \ldots, D_n$ is multiplied by a corresponding multiplication coefficient $f_0, f_1, \ldots, f_n$, and an adder circuit $A_n$ wherein the output of all of the multiplier circuits $M_0, M_1, \ldots, M_n$ are summed. As shown in FIG. 9, in the circuit as described, the output of delay element $D_0$ is represented as the output of a multiplexer 23 as shown in FIG. 3 which is supplied to delay element $D_1$. Thus, delay element $D_0$ is a hypothetical delay element representing zero delay. The output of FIR filter 40 is supplied to a direct current component removal filter 30 as shown in FIG. 3.

To effect a delay circuit having a delay circuit step number given by X (here X is a real number between zero and n), when an $n^{th}$ order Lagrange interpolation is carried out for each node of the shift register, for the $j^{th}$ node, the multiplication coefficient $f_j$, is given by Equ. 12 below.

$$f_j = \frac{\pi(X)}{(X - (a + n))\pi'(X)} \qquad \text{Equ. 12}$$

Here $\pi(X)$ and $\pi'(X)$ are a function and its first derivative as given by Equ. 13 and Equ. 14 below.

$$\pi(X) = (X - a)(X - a + 1) \ldots (X - a + n) \qquad \text{Equ. 13}$$

$$\pi'(X) = \frac{d\pi(X)}{dX} \qquad \text{Equ. 14}$$

In the above equations, a represents the delay step number for the front stage delay circuit through which the signal of each node must pass (here the delay interval for one step of the delay circuit is the same as the individual delay of each of the delay elements $D_0, D_1, \ldots, D_n$).

In converter 105 shown at the top of FIG. 9, the value for each multiplication coefficient $f_0, f_1, \ldots, f_n$ is calculated based on the value for X using the above Equ. 12, 13 and 14. The calculated values for each multiplication coefficient $f_0, f_1, \ldots, f_n$ are then supplied to the FIR filter 40. Additionally, converter 105 supplies the previously described integral portion a of the stage number to multiplexer 23. By substituting the FIR filter 40 thus described and as shown in FIG. 9 for the interpolation circuit 24 in the musical tone generator of FIG. 3, it is possible to further improve the accuracy of the delay interval employed.

Third Preferred Embodiment

In the following section, a third preferred embodiment of the present invention will be described with reference to FIG. 10.

Figure 10:
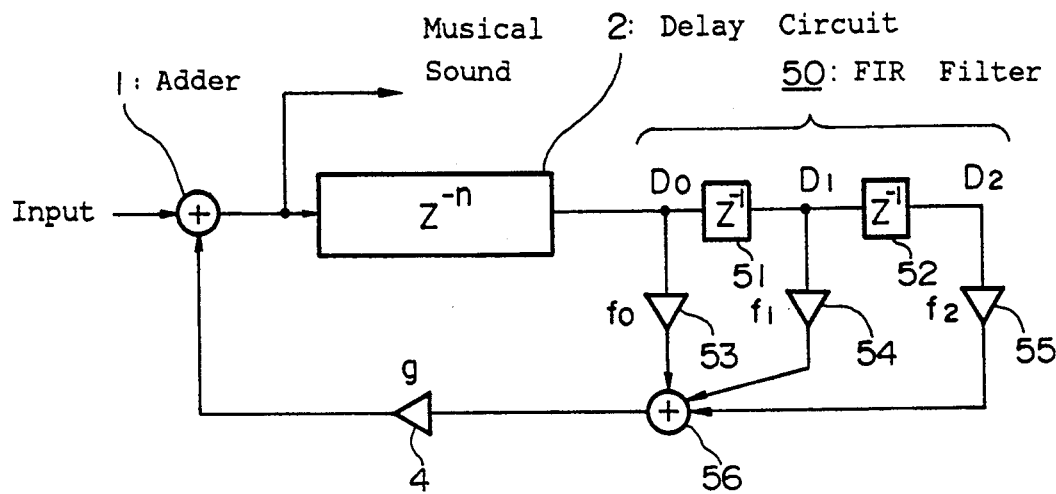
FIG. 10 is a block diagram showing the layout of a musical tone synthesizer of a third preferred embodiment of the present invention.

In FIG. 10, a block diagram illustrating the layout of the musical tone synthesizer of the present embodiment is shown. The musical tone synthesizer of the present embodiment provides an enhancement to the conventional circuit shown in FIG. 2, the FIR filter 3 therein being replaced by a FIR filter 50. The above mentioned FIR filter 50 is made up of a delay circuit 51 and delay circuit 52 wherein each of which the input signal is delayed for unit sampling interval $\tau_s$ and then output, a multiplier circuit 53 wherein the input signal is multiplied by a multiplication coefficient $f_0$ and then output, a multiplier circuit 54 wherein the output of delay circuit 51 is multiplied by a multiplication coefficient $f_1$ and then output, a multiplier circuit 55 wherein the output of delay circuit 52 is multiplied by a multiplication coefficient $f_2$ and then output, and an adder circuit 56 wherein the output of multiplier circuits 53, 54 and 55 are summed and output.

Additionally, the musical tone synthesizer of the present embodiment includes timbre operators (not shown in the drawing) whereby according to their operation, a timbre control circuit (not shown in the drawing) supplies multiplication coefficients $f_0$, $f_1$ and $f_2$ to their respective multiplier circuits 53, 54 and 55. The values for the above mentioned multiplication coefficients $f_0$, $f_1$ and $f_2$ are such that Equ. 15 to 17 below are satisfied.

$$f_0 = (1 - k)/2 \qquad \text{Equ. 15}$$

$$f_1 = k \qquad \text{Equ. 16}$$

$$f_2 = (1 - k)/2 \qquad \text{Equ. 17}$$

The above value k is between 1 and 0.5.

For FIR filter 50, the frequency characteristics $F_2(\omega)$ are given by Equ. 18 below.

$$\begin{aligned} F_2(\omega) &= (1 - k)/2 + k\exp(-j\omega\tau_s) + \\ &\quad ((1 - k)/2)\exp(-2j\omega\tau_s) \\ &= \exp(-j\omega\tau_s) \{((1 - k)/2)\exp(j\omega\tau_s) + k + \\ &\quad ((1 - k)/2)\exp(-j\omega\tau_s)\} \\ &= \exp(-j\omega\tau_s)((1 - k)\cos\omega\tau_s + k) \end{aligned} \qquad \text{Equ. 18}$$

The amplitude $A_2(\omega)$ is then given by Equ. 19 below.

$$\begin{aligned} A_2(\omega) &= |F_2(\omega)| \\ &= (1 - k)\cos(\omega\tau_s) + k \end{aligned} \qquad \text{Equ. 19}$$

According to the above Equ. 19, to the extent that angular frequency $\omega$ is large, $A_2(\omega)$ becomes small. That is to say, FIR filter 50 functions as a low pass filter. Further, to the extent that k is small, the variation of $A_2(\omega)$ with respect to frequency becomes great.

The phase characteristics $P_2(\omega)$ of FIR filter 50 are given by Equ. 20 below.

$$P_2(\omega) = \arctan(F_2(\omega)) \quad \text{Equ. 20}$$
$$= \omega\tau_s$$

Accordingly, the delay interval $\tau_{a2}$ is given by Equ. 21 below.

$$\tau_{a2} = -dP_2(\omega)/d\omega \quad \text{Equ. 21}$$
$$= \tau_s$$

In this way, it can be seen that the delay interval $\tau_{a2}$ of FIR filter 50 is constant even when coefficient k varies. Accordingly, even when adjusting the timbre of the musical tone synthesizer by varying coefficient k, the total delay of the closed loop formed by adder circuit 1, delay circuit 2, FIR filter 50, multiplier circuit 4 sequentially, and back to adder circuit 1 does not vary. Accordingly, the pitch that the operator expects to be generated is in fact generated. With the circuit shown in FIG. 10, multiplier circuit 4 can be eliminated by adding the multiplication coefficient g of multiplier circuit 4 to the multiplication coefficients $f_0$, $f_1$ and $f_2$ of multiplier circuits 53, 54 and 55 respectively.

The FIR filter mentioned above can be utilized as a high-pass filter by choosing the coefficients $f_0$, $f_1$ and $f_2$ so that Equ. 15 to 17 below are satisfied.

$$f_0 = (k-1)/2 \quad \text{Equ. 22}$$
$$f_1 = k \quad \text{Equ. 23}$$
$$f_2 = (k-1)/2 \quad \text{Equ. 24}$$

The amplification characteristics $A_3(\omega)$ of the above filter are given by Equ. 25 below.

$$A_3(\omega) = (k-1)\cos(\omega\tau_s) + k \quad \text{Equ. 25}$$

The coefficient k is chosen so as to be between 0.5 and 1 inclusive as was the case for the low-pass filter described above. It is apparent from Equ. 25 that the FIR filter 50 can have characteristics as a high-pass filter when the coefficients are determined so as to satisfy Equ. 22 through Equ. 24. The delay interval of the filter is unchanged regardless of the value chosen for k.

Only one FIR filter 50 is used in the musical sound synthesizer shown in FIG. 10. Although, more sophisticated characteristics can be given to the synthesizer by including a plurality of low-pass filters and high-pass filters. In such a case also, the delay interval is not influenced by the value k and therefore remains constant, making it possible to synthesize musical sounds at a desired pitch.

Figure 11:
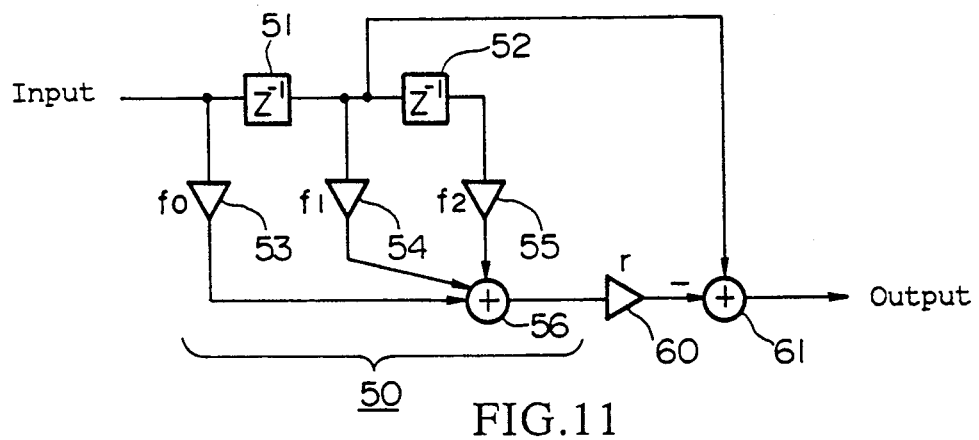
Figure 12:
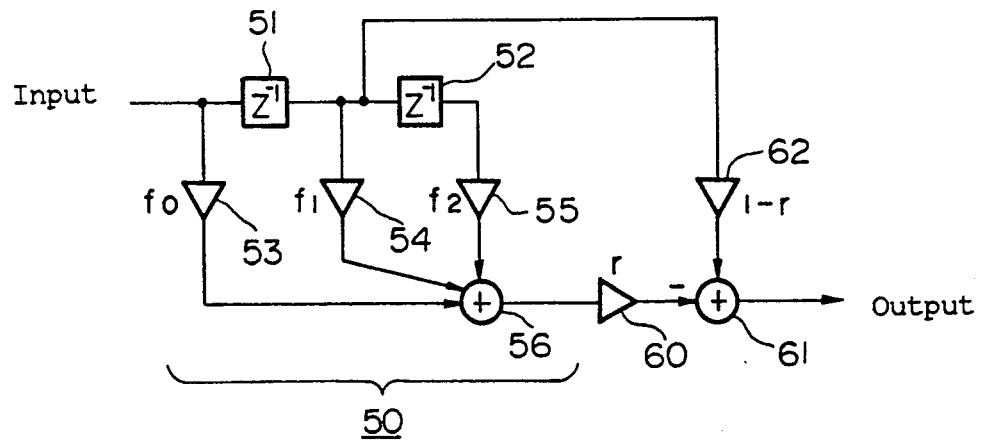

FIG. 11 shows other examples of a low-pass filter or a high-pass filter according to the present invention. The output from the FIR filter 50 is multiplied by coefficient $\gamma$ in multiplier circuit 60, and the product thereby obtained is subtracted from the output of delay circuit 51 in subtracter circuit 61. The coefficient $\gamma$ may be chosen from between 0 and 1 inclusive. When the coefficients $f_0$, $f_1$, $f_2$ are chosen so that the FIR filter 50 functions as a low-pass filter, the filter shown in FIG. 11 outputs a signal wherein low frequency components have been subtracted from the original signal, that is, the filter functions as a high-pass filter. The frequency components subtracted from the original signal are adjusted by varying the coefficient $\gamma$. Conversely, when the coefficients $f_0$, $f_1$, $f_2$ are chosen so that the FIR filter 50 functions as a high-pass filter, the filter shown in FIG. 11 outputs a signal wherein high frequency components have been subtracted from the original signal. That is, the filter functions as a low-pass filter. It is also possible to multiply the output of the delay circuit 51 by a coefficient $1-\gamma$ using a multiplier 62 before the signal is supplied to the subtracter circuit 61.

Figure 13:
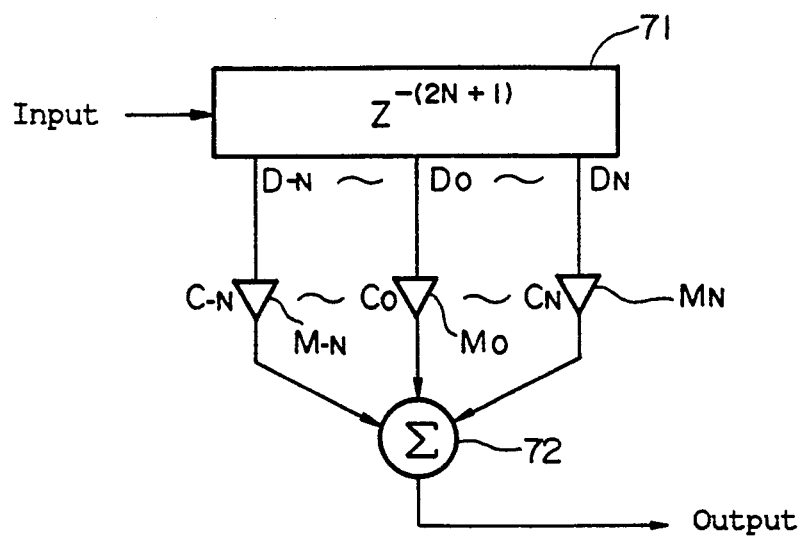
FIGS. 11 through 13 are block diagrams showing variations in the layout of a FIR filter employed in one embodiment of the present invention.

FIR filter 50 multiplies 3 sample signals consecutively located on the time axis within a predetermined time interval. The procedure is shown in FIG. 13 in a generalized form. As shown in FIG. 13, delay circuit 71 consists of $2N+1$ delay units connected sequentially to one another, where N is given by an integer. The delay intervals $\tau_k$ of the data $D_k$ (k is equal to or larger than $-N$ and equal to or smaller than N) output from delay circuit 71 are given by Equ. 26 below.

$$\tau_k = (N+k)\tau_s \quad \text{Equ. 26}$$

The multipliers $M_k$ (k is equal to or larger than $-N$ and equal to or smaller than N) multiplies each $D_k$ by a corresponding $C_k$ (k is equal to or larger than $-N$ and equal to or smaller than N). Then, adder circuit 72 adds the products obtained by the above multiplication operation. The coefficients $C_k$ are determined so that the total of the $2N+1$ coefficients is equal to 1, and $C_k$ is equal to $C_{-k}$.

$$C_k = C_{-k} \quad \text{Equ. 27}$$

Given the above conditions and Equ. 27, the frequency response function shown in Equ. 28 is obtained.

$$\begin{aligned}F(w) &= C_{-N} + C_{-N-1}\exp(-j\omega\tau_s) + \ldots \quad \text{Equ. 28}\\ &\quad + C_0\exp(-Nj\omega\tau_s) + \ldots \\ &\quad + C_N\exp(-(2N+1)j\omega\tau_s)\\ &= \exp(-Nj\omega\tau_s)(C_{-N}\exp(Nj\omega\tau_s) + \ldots \\ &\quad + C_{-1}\exp(j\omega\tau_s) + C_0 + C_1\exp(-j\omega\tau_s) + \ldots \\ &\quad + C_N\exp(-Nj\omega\tau_s))\end{aligned}$$

The above equation Equ. 28 is reformed to the following form by introducing equation Equ. 27.

$$F(w) = \exp(-Nj\omega\tau_s)(C_0 + 2C_1\cos(\omega\tau_s) + \ldots + 2C_N\cos(N\omega\tau_s)) \quad \text{Equ. 29}$$

The amplification characteristics A(w) of the above filter is expressed by Equ. 30 below.

$$A(w) = C_0 + 2C_1\cos(\omega\tau_s) + \ldots + 2C_N\cos(N\omega\tau_s) \quad \text{Equ. 30}$$

The phase characteristics P(w) of the filter and delay interval $\tau$ are expressed by Equ. 31 and Equ. 32 below, respectively.

$$P(w) = -N\omega\tau_s \quad \text{Equ. 31}$$
$$\tau_a A = N\omega\tau_s \quad \text{Equ. 32}$$

The above equations show that the delay interval of the filter is independant of the coefficients $C_k$. By virtue of this characteristic of the filter mentioned above, variation of timbre without changing the pitch becomes possible.

Other applications of the present invention

A musical sound synthesizer can be created by making use of a delay circuit as described in the first or second preferred embodiments, and the FIR filter described in the third preferred embodiment. The musical sound synthesizer thus obtained is capable of broadly varying and finely adjusting the musical timbre, while exactly and continuously controlling the pitch of the sound.

The first and second embodiments were explained in the form of applications to the generation of musical sound for woodwind instruments, string instruments, pianos, etc., and the third embodiment described an application for damping musical sounds. Even so, application of the present invention is not limited to synthesize the sounds of these above listed instruments but is applicable to any kind of musical instruments. In the same manner, the delay circuit and the FIR filter according to the present invention is applicable to synthesize any part of any conventional musical instrument. For example, the FIR filter described in the third preferred embodiment can be used to simulate the sound pressure loss due to tone holes of woodwind instruments. Application of the present invention is not limited to those described as preferred embodiments. The invention includes all the possible modifications which can be derived from the invention depicted by the whole of the description and the claims.

What is claimed is:

1. A musical sound synthesizer for synthesizing musical sounds, the synthesizer comprising:
resonance means for generating a resonance signal corresponding to a musical sound to be synthesized, the resonance signal generated in response to an input signal and a feedback signal;
signal delay means, forming a portion of the resonance means, for delaying a signal inputted thereto, by a time corresponding to a tone pitch of the musical sound; and
filter means, forming a portion of the resonance means, for variably changing a frequency characteristic of the resonance signal without changing a delay time encountered in the filter means, so that the tone pitch of the musical sound does not change when the frequency characteristic is changed by the filter means so as to change a tone color of the musical sound.

2. A musical sound synthesizer for synthesizing musical sounds, the synthesizer comprising:
resonance means for generating a resonance signal in response to an input signal and a feedback signal, said resonance signal corresponding to a musical sound to be synthesized;
first delay means forming a portion of said resonance means, said first delay means for delaying said input signal by a time interval in order to vary a pitch of said resonance signal; and
filter means forming a portion of said resonance means, said filter means for varying a tone color of said resonance signal, said filter means comprising:
(a) second delay means for delaying said resonance signal by $2N+1$ delay intervals $\tau_k$ and outputting $2N+1$ corresponding delayed signals, said delay intervals $\tau_k$ being products of a cardinal interval $\tau_s$ and $2N+1$ integers $(N+k)$, with each delay interval $\tau_k$ given by $\tau_k = (N+k)\tau_s$, with N being a natural number and k being an integer number of value greater than or equal to $-N$ and less than or equal to N; and
(b) calculation means for respectively multiplying said delayed signals by $2N+1$ coefficients $f_k$, adding $2N+1$ products obtained by said multiplication, and said sums of said products, wherein said multiplication coefficients $f_k$ satisfy the following relation $f_k = f_{-k}$, wherein said tone color of said resonance signal is varied by changing harmonic content of said resonance signal without changing said pitch.

3. A musical sound synthesizer according to claim 2 wherein said calculation means multiplies said sum of products by a first predetermined value to obtain a first product, multiplies said input signal by a second predetermined value to obtain a second product, calculates a difference between said first product and said second product, and outputs said difference.

4. A musical sound synthesizer according to claim 3 wherein said first predetermined value and said second predetermined value are both equal to one.

* * * * *